United States Patent
Lenssen et al.

(10) Patent No.: US 6,252,796 B1
(45) Date of Patent: Jun. 26, 2001

(54) DEVICE COMPRISING A FIRST AND A SECOND FERROMAGNETIC LAYER SEPARATED BY A NON-MAGNETIC SPACER LAYER

(75) Inventors: Kars-Michiel Hubert H. Lenssen; Hans Willem W. Van Kesteren, both of Eindhoven (NL)

(73) Assignee: U.S. Philips Corporation, New York, NY (US)

( * ) Notice: Subject to any disclaimer, the term of this patent is extended or adjusted under 35 U.S.C. 154(b) by 0 days.

(21) Appl. No.: 09/529,524

(22) PCT Filed: Aug. 4, 1998

(86) PCT No.: PCT/EP99/05773

§ 371 Date: Apr. 13, 2000

§ 102(e) Date: Apr. 13, 2000

(87) PCT Pub. No.: WO00/10024

PCT Pub. Date: Feb. 24, 2000

(30) Foreign Application Priority Data

Aug. 14, 1998 (EP) .................................................. 98202728

(51) Int. Cl.$^7$ ...................................................... G11C 11/15
(52) U.S. Cl. ............................................ 365/173; 365/171
(58) Field of Search ..................................... 365/173, 171, 365/157, 158

(56) References Cited

U.S. PATENT DOCUMENTS 5,859,754 * 1/1999 Tong et al. ............................ 360/113
6,124,711 * 9/2000 Tanaka et al. ........................ 324/252

* cited by examiner

Primary Examiner—Huan Hoang
(74) Attorney, Agent, or Firm—Steven R. Biren

(57) ABSTRACT

A sensor or a memory element comprises a fixed or free ferromagnetic layer. To increase the ease of writting the free layer (for memories) or the fixed layer (for sensors) the layer to be written or switched comprises multilayer configuration comprising two ferromagnetic sublayers separated by a non-magnetic spacer layer, the two ferromagnetic sublayers being magnetically coupled in such manner that their magnetization directions are anti-parallel and the device comprises means for directing a in-plane switching or re-setting current through the multilayered configuration, the current direction being transverse to the magnetization directions of the magnetically coupled sub-layers.

7 Claims, 3 Drawing Sheets

DEVICE COMPRISING A FIRST AND A SECOND FERROMAGNETIC LAYER SEPARATED BY A NON-MAGNETIC SPACER LAYER

BACKGROUND OF THE INVENTION

The invention relates to a device having a first and a second ferromagnetic layer separated by a non-magnetic spacer layer, wherein the resistance is dependent on the orientation of the magnetisation directions of the first and second ferromagnetic layers.

The Giant Magneto-Resistance (GMR) effect and the Tunnel Magneto-Resistance (TMR) effect provide possibilities to realise readout heads for magnetic recording, sensitive magnetic sensors and nonvolatile magnetic memories (MRAM's). Such devices comprise a first and a second ferromagnetic layer separated by a non-magnetic spacer layer. The magnetization of one of the layers is fixed (fixed layer), the other (free layer) can have any orientation with respect to the magnetisation of the fixed layer (for sensors) and for magnetic memories can be switched between two directions (i.e. parallel or anti-parallel to the fixed magnetisation). Due to the GMR (TMR) effect the resistance for both configurations is different, and the state of the memory ('1' or '0') can be determined by measuring the resistance of the GMR system. Switching the magnetisation direction of the free layer changes the state of the MRAM. Conventionally an additional conductor is used to switch the magnetisation direction of the free layer. Conventional MRAMs require a relatively large write current. Because of power consumption restrictions this current should be as small as possible. However, on the other hand the memory should be insensitive to disturbing external magnetic fields (to avoid unintended erasing of data). Similar techniques are used in read-out heads for magnetic recording in which the resistance is dependent on the magnetisation direction in the free layer vis-a-vis the fixed layer. In such read-out heads it is advantageous if the magnetisation direction in the fixed layer can be reset relatively easily.

SUMMARY OF THE INVENTION

It is an object of the invention to provide a device as described in the opening paragraph, which requires a reduced current for switching or resetting the magnetisation direction of one or both of the layers.

To this end one or both of the first and second layers (the 'free' layer or fixed layer of which the magnetisation direction is to be switched or reset) comprises a multilayer configuration comprising two ferromagnetic sublayers separated by a non-magnetic (preferably well conducting) spacer layer. The two magnetic sublayers are magnetically coupled (e.g. by exchange coupling or magnetostatic coupling) in such manner that their magnetisation directions are anti-parallel. This is similar to a generalised Artificial Anti-Ferromagnet (AAF) configuration. Preferably the coupled magnetic sublayers show uniaxial anisotropy (e.g. due to shape anisotropy and/or induced anisotropy). Since the total magnetic moment of an AAF is very small (theoretically down to zero) the rigidity with respect to external fields is strongly enhanced. Only very large external magnetic fields can switch the magnetic moment of the AAF. Thus the multilayer stack is relatively insensitive to external fields but it can nevertheless be switched (or oriented) relatively easily. To this end the device in accordance with the invention comprises means for directing an in-plane switching or resetting current through the multilayered configuration, the current direction being transverse to the magnetisation directions of the magnetically coupled sub-layers. The in-plane internal current, in contrast to a current in a conductor outside the layer(s) to be switched as is conventional, only has to overcome the anisotropy of a single magnetic (sub)-layer. The distance between the current and the said (sub)-layer(s) is further more very small, which increases substantially the magnetic field at the sub-layer(s) to be switched and consequently reduces the current need. The required current can be as small as the order of 1 mA (e.g. for Permalloy). If the elements are of ($\mu$m-scale or less, it is preferred to use materials and dimensions that can withstand the required current density. However, since the switching or resetting current only has to be applied as a very short pulse, many materials are useful.

BRIEF DESCRIPTION OF THE DRAWING

These and further aspects of the inventions will be apparent from and elucidated with reference to the embodiments described hereafter. In particular ideas about the ways this switching element may be used advantageously in applications will be described, including three important simplifications of magnetic devices will be described: a magnetic memory, a sensor and a read head. In the drawings.

The Figures are schematic and not drawn to scale, and, in general, like reference numerals refer to like parts.

DESCRIPTION OF THE PREFERRED EMBODIMENT

Figure 1:
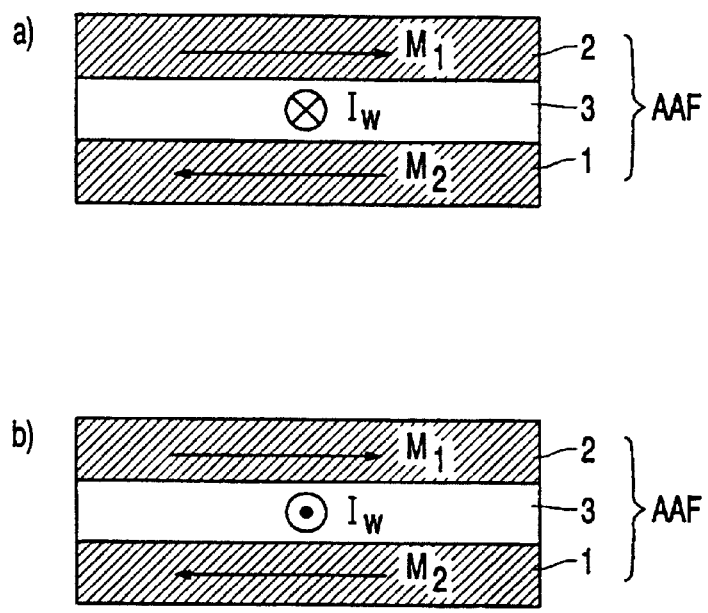
FIG. 1 shows schematically and in cross-section the multilayer configuration for a device in accordance with the invention.

FIG. 1 shows schematically and in cross section a multilayer stack as used in or part of a GMR or TMR structure either as the fixed or the free layer. This multilayer stack comprises two ferromagnetic sub-layers (1,2) separated by a non-magnetic (preferably well conducting) spacer sub-layer (3). The two ferromagnetic sub-layers are magnetically coupled (e.g. by exchange coupling or magnetostatic coupling) in such manner that their magnetisation directions $M_1$ and $M_2$ are anti-parallel, as is indicated in FIG. 1 by arrows. This is similar to a generalised Artificial Anti-Ferromagnet (AAF) configuration. Preferably the ferromagnetic sub-layers 1, 2 show uniaxial anisotropy (e.g. due to shape anisotropy and/or induced anisotropy). Since the total magnetic moment of an AAF is very small (theoretically down to zero) because of the anti-parallel orientation of the magnetic moments in sub-layers 1 and 2 any effect of an externally applied magnetic field on sub-layer 1 is counteracted by an, at least in first order approximation, equally large effect, but of opposite sign on sub-layer 2. The rigidity with respect to external fields is thus strongly enhanced. Only very large external magnetic fields can switch the magnetic moment of the AAF multilayer. Thus the multilayer stack is relatively insensitive to external fields but it can nevertheless be switched (or oriented) relatively easily. A in-plane (i.e. generally parallel to the plane of the layers) current I (in FIG. 1 a writing current $I_W$ is shown) through the multilayer stack, for instance through sub-layer 3 will generate an internal magnetic field. The interaction of this internal magnetic field with the magnetic moment of sub-layers 1 and 2 is such that the actions in fact add up, instead of counteracting each other. Thus switching the magnetisation direction of sub-layers 1 and 2 (more in particular of sublayer 1, nearest the separating layer 4 (or 6, see FIG. 3) becomes easy and requires only little writing current $I_W$. Depending on the direction of the writing current $I_W$ the configuration of FIGS. 1a or 1b can be obtained. The crux of the invention lies herein that a switching or resetting current is passed through the multilayer stack. Such a switching or resetting current is to be distinguished from a sensing current, although a sensing current may or may not flow in a same direction as the switching or resetting current. A sensing current (as the word already indicates) is such that the resistance is measured to sense the magnetisation status of the free layer (in MRAM's) by means of a resistance measurement. The sensing current itself does not and should not influence the measurement and thus does not and should not influence the magnetisation directions. The switching or resetting current on the other hand does do so. In FIGS. 1a and 1b the switching current flows through sub-layer 3, it may however also flow through either or both of sub-layers 1 and 2.

A magnetic memory (based on the GMR effect) comprises in its simplest form two ferromagnetic layers separated by a non-magnetic spacer layer. In the examples shown in FIGS. 2A (cross-sectional view) and 2B (top view), one of the ferromagnetic layers is formed by the AAF stack (1, 2, 3), the other ferromagnetic layer (5) has a fixed magnetisation $M_f$ and the two layers are laterally separated by non-magnetic spacer layer 4. The AAF stack and layer 5 could also be vertically separated by a separating layer 4, i.e. form a vertical stack 2, 3, 1, 4, 5 (similar to the configuration of FIG. 3 for a TMR). The magnetisation direction of one ferromagnetic layer (5) is fixed, the other magnetisation of the layer at the other side of the separating layer 4 can be switched between two directions (i.e. parallel and anti-parallel to the fixed magnetisation) by a writing current $I_W$ through the AAF structure. Due to the GMR effect the resistance for both configurations is different, depending on the magnetisation direction of sublayer 1, i.e. the layer at, seen from the layer with the fixed magnetisation orientation (layer 5), the opposite side of spacer layer 4. The state of the memory ('1' or '0') can be determined by measuring the resistance of the GMR system. To this end the relation between a reading or sensing current $I_r$ and an applied voltage can be measured. Normally an additional conductor, which is electrically separated from the GMR system by an isolating layer, is used to switch the magnetisation direction of the switchable layer 1. As explained above this poses a dilemma, since, on the one hand, the current required for switching is preferably kept small, which means that the field generated by the current is as small as possible, thus the sensitivity of the switchable layer for the external field generated by the current through the additional conductor should be relatively high, but, on the other hand the sensitivity of the device for other external magnetic fields (stray fields) should be small to prevent unwanted switching of the memory leading to errors in the information contained in the memory. 'Stray fields' comprise, in this respect also magnetic fields generated at an adjacent or nearby memory element to switch said adjacent or nearby memory. This dilemma gets ever greater as the devices get smaller and the distance between memories get smaller (minutiarisation).

Figure 2A:
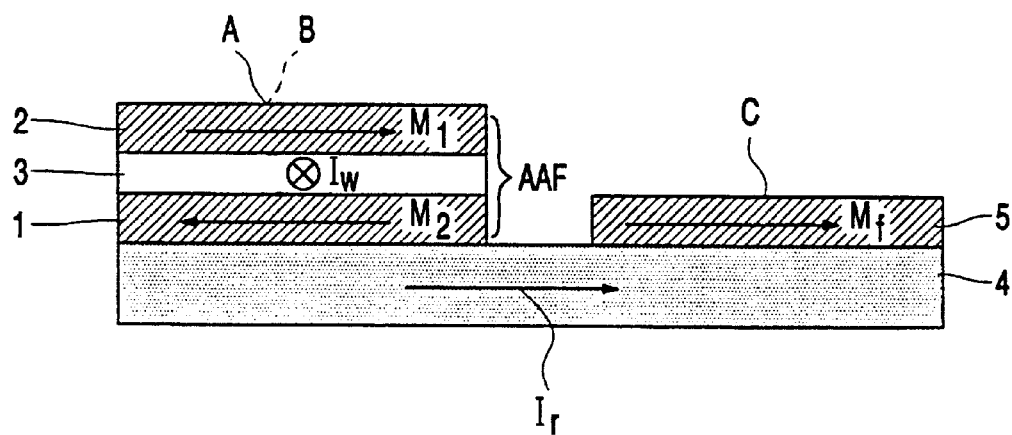
FIG. 2A shows schematically and in cross-section an embodiment of a device in accordance with the invention, namely a lateral magnetic memory.
Figure 2B:
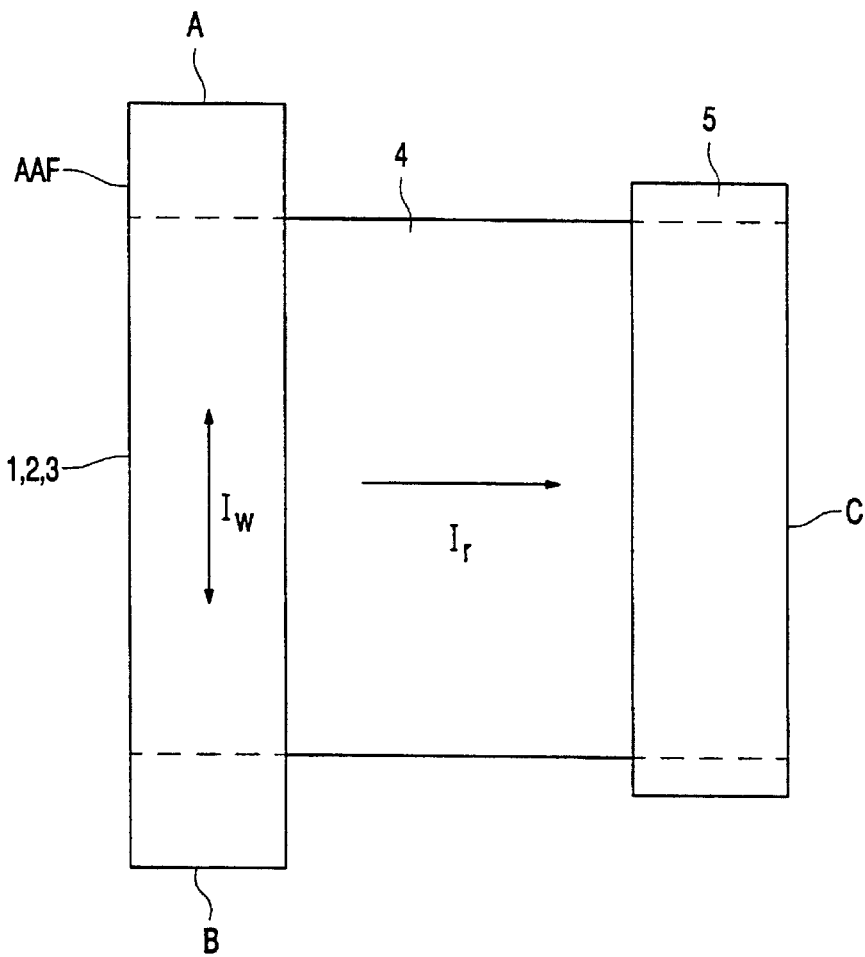
FIG. 2B shows schematically and in top view a device as illustrated in FIG. 2A.
Figure 3:
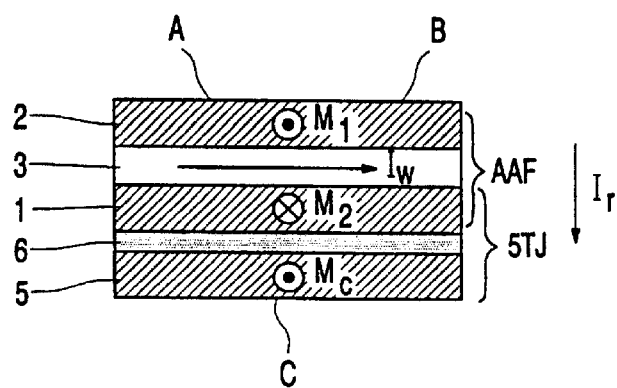
FIG. 3 shows schematically and in cross-section an embodiment of a device in accordance with the invention, namely a spin tunnel junction memory.

This invention resolves at least partly the dilemma allowing to read and write (i.e. the switch the magnetisation direction of the switchable layer) the memory without an additional conductor. The resistance of the GMR system (in particular across the spacer layer) is preferably (somewhat) higher than the (in-plane) resistance of the AAF. This is for example the case in a lateral magnetic device as shown in FIGS. 2A, 2B and a spin tunnel device as shown in FIG. 3. In FIG. 3 the AAF multi-stack (1,2,3) is separated from layer 5 with a fixed magnetisation direction by a non-conducting separation layer 6. One of the magnetic layers (the bottom layer 1 in the FIGS. 2 and 3) of the AAF serves as the switchable magnetic layer of the TMR system. Layers 1, 6 and 5 form a spin tunnel junction (STJ), the resistance of which is dependent on the mutual orientation of the magnetisation direction in (sub)layers 1 and 5. For use as a memory the magnetisation of the magnetic layer that doesn't belong to the AAF is preferably fixed (e.g. by using a material with a high coercivity or by exchange biasing).

The memory can be written by a writing current $I_W$ with the right sign between connections A and B, which form the means for directing an in-plane switching or writing current through the multi-stack. The memory can be read by measuring the resistance between terminals A (or B) and C (preferably with an even smaller reading current $I_r$).

Figure 4:
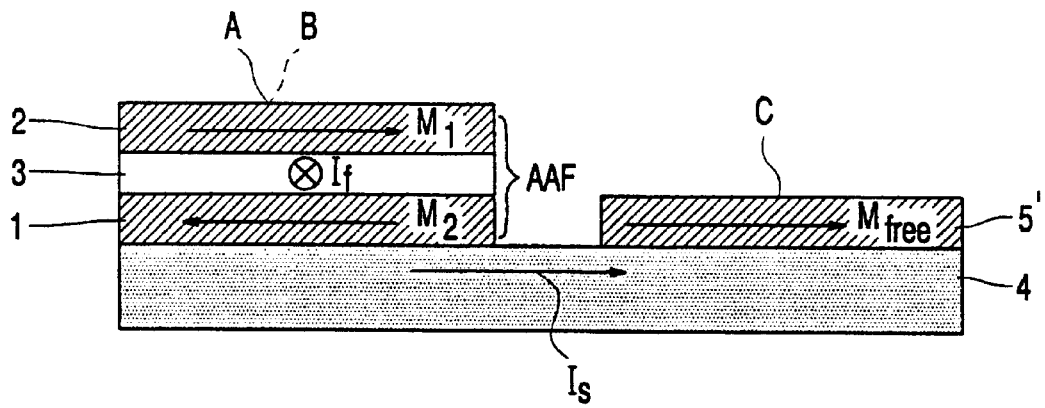
FIG. 4 shows schematically and in cross-section an embodiment of a device in accordance with the invention, namely a lateral magnetic sensor.
Figure 5:
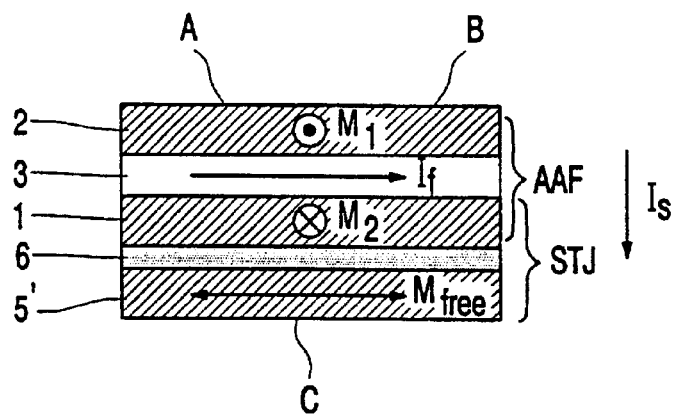
FIG. 5 shows schematically and in cross-section an embodiment of a device in accordance with the invention, namely a spin tunnel junction sensor.

Above the invention has been described with references to embodiments in which the device in accordance with the invention comprises a magnetic memory. The devices as shown in general form in the FIGS. 2 and 3 can also be used as magnetic sensors, but in this case the layer 5 with a fixed magnetisation may be replaced by a soft magnetic layer 5' with a "free" (i.e. sensitive) magnetisation (FIGS. 4 and 5). The AAF (multi-stack 1, 2, 3) now takes over the role of the fixed magnetisation layer. Application of a fixing current $I_f$ fixes the magnetisation in the AAF stack, and more in particular fixes the magnetisation of sublayer 1. Such a fixing current $I_f$ can be applied over leads A and B, which form in this example means for directing an in-plane current ($I_f$) through the stack. Directing a sensing current $I_s$ through leads A (or B) and C will enable to measure the resistance of the sensor and thereby measure the strength of an magnetic field.

The first advantage is that the magnetisation of the fixed layer can be (re-)set by applying a re-setting current between terminals A and B. This can be very useful for magnetic sensors or read heads at the end of the production process or after they have been exposed to large magnetic fields. It is important to note that no heating is required for this reset, in contrast to e.g. the present GMR heads based on exchange-biased spin valves. This also makes the realisation of a Wheatstone-bridge sensor much simpler. Moreover, the AAF eliminates the need for exchange biasing, which greatly improves the temperature stability of the sensor.

The second advantage is that the output of the sensor may be inverted by switching the direction of the fixed magnetisation. By switching periodically this provides a method to eliminate offsets in the output and enables sensitive measurements of small magnetic fields.

A current carrying AAF is also applicable to magnetic read heads. The main advantage is that no exchange biasing and thereby no heating is required to set the fixed layer.

Figure 6:
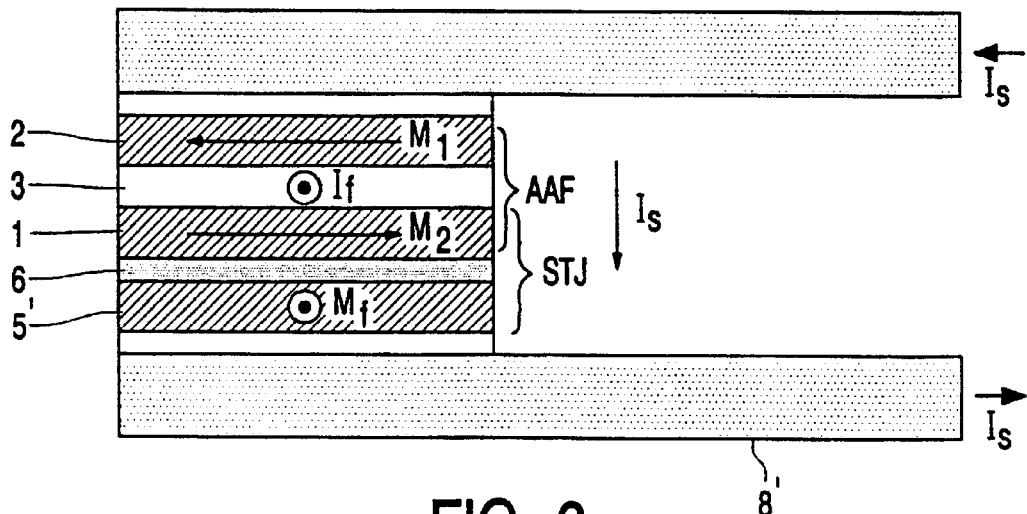
FIG. 6 shows schematically and in cross-section an embodiment of a device in accordance with the invention, namely a magnetic read head.

The use of spin tunnel devices in heads is complicated by the required direction of the fixed magnetisation (perpendicular to the media). This could be solved by means of a current carrying AAF (as shown in FIG. 6). The magnetisation of the free layer will be parallel to the head surface (in zero field) due to the shape anisotropy (and/or induced anisotropy). The sense currents $I_s$ can be applied through shields 8, 8' when non-magnetic conducting gaps are used.

The described layer stack and switching method simplifies the configuration of GMR or TMR memory elements significantly and solve or reduces the present problem of too large required writing currents. Besides this, the invention also provides a way to (re-)set magnetic field sensors and read heads. The switching may also be applied periodically as a method to eliminate output offsets for sensitive sensors or as a modulation technique.

What is claimed is:

1. A device having a first and a second ferromagnetic layer separated by a non-magnetic spacer layer whereby forming a multilayer configuration, the two ferromagnetic layers being magnetically coupled in such manner that a magnetization direction of the first ferromagnetic layer is antiparallel to a magnetization direction of the second ferromagnetic layer and the device comprises means for directing a in-plane switching or resetting current through the multilayered configuration.

2. A device as claimed in claim 1, wherein the two ferromagnetic layers separated by a non-magnetic spacer layer are a multilayer configuration being part of a stock of layers including at least a third ferromagnetic layer separated from the first or second ferromagnetic layer by at least a non-magnetic spacer layer.

3. A device as claimed in claim 2, wherein the direction of said current is transverse to the magnetization directions of the magnetically coupled sub-layers.

4. A device as claimed in claim 3, characterized in that the device is a magnetic memory and the one of the first and second layers is a free layer.

5. A device as claimed in claim 3, characterized in that the device is a magnetic sensor or a magnetic read head and the one of the first and second layer is a fixed layer.

6. A device as claimed in claim 3, characterized in that the device comprises a spin tunnel junction.

7. A device as claimed in claim 3, characterized in that the device is based on the GMR effect.

* * * * *